United States Patent
Jun

(10) Patent No.: US 8,030,116 B2
(45) Date of Patent: Oct. 4, 2011

(54) CMOS IMAGE SENSOR AND METHOD FOR FABRICATING THE SAME

(75) Inventor: Sung Ho Jun, Seoul (KR)

(73) Assignee: Dongbu HiTek Co., Ltd., Seoul (KR)

( * ) Notice: Subject to any disclaimer, the term of this patent is extended or adjusted under 35 U.S.C. 154(b) by 54 days.

(21) Appl. No.: 12/554,683

(22) Filed: Sep. 4, 2009

(65) Prior Publication Data

US 2010/0065897 A1  Mar. 18, 2010

(30) Foreign Application Priority Data

Sep. 16, 2008 (KR) .................. 10-2008-0090718

(51) Int. Cl.
  *H01L 21/00* (2006.01)
  *H01L 31/0232* (2006.01)
(52) U.S. Cl. .............. 438/70; 257/432; 257/E31.127
(58) Field of Classification Search .............. 257/294, 257/432, E31.121, E31.127; 438/70
  See application file for complete search history.

(56) References Cited

U.S. PATENT DOCUMENTS

| | | | | |
|---|---|---|---|---|
| 2005/0258462 A1* | 11/2005 | Min | ............ | 257/292 |
| 2006/0097295 A1* | 5/2006 | Kim | ............ | 257/292 |
| 2006/0138487 A1* | 6/2006 | Kim | ............ | 257/292 |
| 2006/0231898 A1* | 10/2006 | Jeong et al. | ............ | 257/359 |
| 2007/0102621 A1* | 5/2007 | Kim | ............ | 250/208.1 |
| 2007/0145422 A1* | 6/2007 | Park | ............ | 257/233 |
| 2008/0258249 A1* | 10/2008 | Hong | ............ | 257/432 |
| 2009/0200623 A1* | 8/2009 | Qian et al. | ............ | 257/432 |

FOREIGN PATENT DOCUMENTS

KR  10-2006-0077064 A  7/2006
KR  10-2007-0071016 A  7/2007

OTHER PUBLICATIONS

Korean Office Action dated Jun. 23, 2010; Korean Patent Application No. 10-2008-0090718; Korean Intellectual Property Office, Republic of Korea.

Eun Ji Kim; "CMOS Image Sensor Having Triple Micro-Lens Structure and Method for Manufacturing the Same"; Korean Patent Abstracts; Publication No. 1020060077064 A; Publication Date: Jul. 5, 2006; Korean Intellectual Property Office, Republic of Korea.

Won Ho Lee; "Image Sensor and its Fabricating Method to Increase the Quantity of the Light Irradiated to a Photodiode Through Each Color Filter"; Korean Patent Abstracts; Publication No. 1020070071016 A; Publication Date: Jul. 4, 2007; Korean Intellectual Property Office, Republic of Korea.

* cited by examiner

*Primary Examiner* — Lex Malsawma
(74) *Attorney, Agent, or Firm* — The Law Offices of Andrew D. Fortney; Andrew D. Fortney

(57) ABSTRACT

A CMOS image sensor and a method for fabricating the same are disclosed. The method includes forming a plurality of color filters on a substrate, each color filter having a curvature, and forming microlenses on the color filters that each has a radius of curvature that varies with the wavelength of the color filter on which it is formed.

15 Claims, 5 Drawing Sheets

CMOS IMAGE SENSOR AND METHOD FOR FABRICATING THE SAME

CROSS REFERENCE TO RELATED APPLICATION

This application claims the benefit of the Korean Patent Application No. 10-2008-0090718, filed on 16 Sep. 2008, which is hereby incorporated by reference as if fully set forth herein.

BACKGROUND OF THE DISCLOSURE

1. Field of the Disclosure

The present invention relates to semiconductor devices, and, more particularly, to a CMOS image sensor and a method for fabricating the same.

2. Discussion of the Related Art

In general, image sensors are semiconductor devices for converting an optical image to electrical signals. Image sensors may be classified as a charge coupled device (CCD) and the CMOS (Complementary Metal Oxide Silicon) image sensor.

The CMOS image sensors widely used currently are switching type devices in which MOS transistors are fabricated on a semiconductor substrate as unit pixels using a CMOS technology, in which control circuits and signal processing circuits are peripheral circuits. The control circuits and signal processing circuits detect outputs of the unit pixels in succession using the MOS transistors.

That is, the CMOS image sensor has a photodiode and a plurality of MOS transistors in the unit pixel for detecting and/or transmitting the electric signal of each unit pixel in succession by a switching system to produce an image.

Since the CMOS image sensor uses a CMOS fabrication technology, the CMOS image sensor is advantageous in low power consumption, a simple fabrication process owing to a small number of photolithographic process steps, and so on.

A related art CMOS image sensor will be described with reference to the attached drawings, in which FIG. 1 illustrates a partial cross-section of a related art CMOS image sensor.

An insulating film 101 (e.g., a gate insulating film or an interlayer insulating film) is formed on a semiconductor substrate 100, and a first protective film 102 (e.g., an oxide film or a nitride film) is formed on an entire surface of the insulating film 101.

A thermal resin or thin TEOS layer is deposited on an entire surface of the semiconductor substrate 100 for protecting a micro-lens formed in a successive step, to form a second protective film 103, and a silicon nitride film or a silicon oxynitride film is deposited on an entire surface of the second protective film 103, to form a planarizing layer 104.

Then, a color filter layer 105 is formed on the planarizing layer 104 over every photodiode region (not shown). Each of the color filters in the color filter layer 105 is formed by coating a color resist and photolithographically etching the color resist with a mask provided separately.

Then, an overcoating layer 106 is formed on an entire surface of the substrate having the color filter layers 105.

A polymer is adhered onto the overcoating layer 106 as a microlens material layer. Then, the polymer (e.g., a photosensitive film) is patterned by exposure and development, to define microlens regions. The microlens material layer of the polymer is patterned selectively, to form a microlens pattern over the color filter layer 105. The microlens pattern is subjected to reflow heat treatment to form hemispherical microlenses 107 having a fixed curvature.

However, in this microlens forming method, the planarizing layer on the color filter layer reduces optical efficiency.

Moreover, the planarizing layer increases a distance between the photodiode and the microlens to be formed in a following step by the thickness of the planarizing layer, thereby failing to maximize the sensitivity of the CMOS image sensor.

SUMMARY OF THE DISCLOSURE

Accordingly, the present invention is directed to a CMOS image sensor and a method for fabricating the same.

An object of the present invention is to provide a CMOS image sensor and a method for fabricating the same which can remove one or more steps in the fabrication method due to the color filter and/or the planarizing layer.

Additional advantages, objects, and features of the disclosure will be set forth in part in the description which follows and in part will become apparent to those skilled in the art upon examination of the following or may be learned from practice of the invention. The objectives and other advantages of the invention may be realized and attained by the structure (s) and process(es) particularly pointed out in the written description and claims hereof as well as the appended drawings.

To achieve these objects and other advantages and in accordance with the purpose of the invention, as embodied and broadly described herein, a method for fabricating a CMOS image sensor includes forming a plurality of color filters each having a curvature on a substrate, and forming microlenses on the color filters having radii of curvature that vary with a wavelength of the corresponding color filter, respectively.

In another aspect of the present invention, a CMOS image sensor includes a plurality of color filters on a substrate, each color filter having a curvature, and depositing microlenses on the color filters, the microlenses having radii of curvature that vary with a wavelength of the corresponding color filter, respectively.

Thus, by omitting the planarizing layer and depositing the microlenses on the color filters, the present CMOS image sensor and the method for fabricating the same can simplify the fabrication process and improve the sensitivity of the CMOS image sensor.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle(s) of the disclosure. In the drawings.

DESCRIPTION OF SPECIFIC EMBODIMENTS

Reference will now be made in detail to specific embodiments of the present invention, examples of which are illustrated in the accompanying drawings. Wherever possible, the same reference numbers will be used throughout the drawings to refer to the same or like parts.

Figure 1:
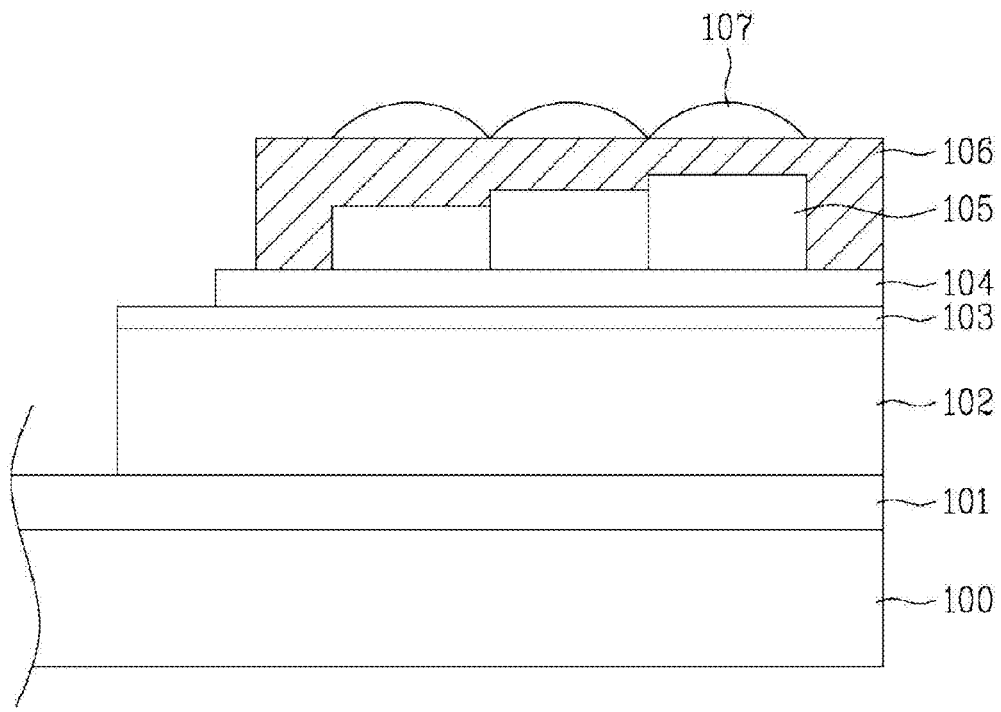
FIG. 1 illustrates a cross-section of a related art CMOS image sensor.
Figure 2:
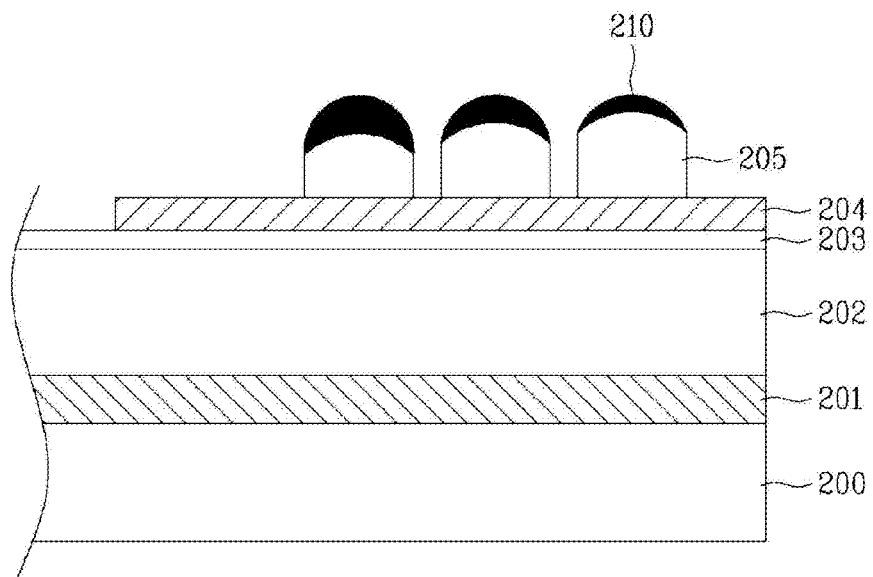
FIG. 2 illustrates a cross-section of an exemplary CMOS image sensor in accordance with one or more embodiments of the present invention.

FIG. 2 illustrates a cross-section of an exemplary CMOS image sensor in accordance with one or more embodiments of the present invention.

Referring to FIG. 2, the CMOS image sensor includes a semiconductor substrate 200 having a lower device layer (not shown) with at least one photodiode region for generating an electrical charge from a quantity of light incident thereto and metal lines formed thereon, an insulating film 201 on the semiconductor substrate 200, a first protective film 202 on an entire surface of the insulating film 201, a second protective film 203 comprising a thermal resin or a thin TEOS-based oxide layer on the first protective film 202 for protecting microlenses to be formed in a following step, and a planarizing layer 204 comprising silicon nitride or silicon oxynitride deposited on an entire surface of the second protective film 203. The insulating film 201 may comprise a gate insulating film or an interlayer insulating film, and the first protective film 202 may comprise an oxide film (e.g., comprising silicon dioxide) or a nitride film (e.g., comprising silicon nitride).

The CMOS image sensor also includes a color filter layer 205 including red, green and blue color filters (or, alternatively, yellow, cyan and magenta color filters) on the planarizing layer 204. Each color filter may be formed as one unit with a lens of a fixed curvature over a corresponding photodiode region for focusing and transmitting a light of a specific wavelength to the photodiode region.

The color filters in layer 205, each formed as one unit with a lens, have thicknesses that may vary with the wave length of light passing through the color filter. Furthermore, the color filters are not flat, but rather, each color filter has a fixed curvature.

Each of the color filters in the color filter layer 205 may also include a microlens 210 formed as one unit with each of the color filter layers 205. The microlenses 210 may comprise an oxide (e.g., a TEOS- or silane-based silicon oxide), a spin-on glass, or a substantially transparent or translucent polymeric resist material.

By having radii of curvature that are inversely proportional to the wave lengths of light passing through the color filter, the microlenses 210 on the plurality of color filters can control wave lengths and focal points of the color filters having wave lengths different from one another. In some embodiment, the height of the color filter having a first color differs from the heights of the color filters having a second or third color, and the height of the color filter having the second color differs from the height of the color filter having the third color. In one embodiment, the height of the color filters is also inversely proportional to the wavelength(s) of light passing through the color filter. Therefore, a red color filter may have a first height less than the heights of corresponding green and blue color filters, and the green color filter may have a second height less than the height of the blue color filter.

Since the microlens 210 has a dome shape and the color filter layer 205 has a fixed curvature, the unitary microlens 210 and color filter 205 focuses light on or near a light-receiving structure in the image sensor and transmits a light of a specific wavelength or wavelength band due to the color filter layer 205 under the microlens 210. Moreover, since the CMOS image sensor of the present invention has no planarizing layer between the color filter layer 205 and the microlens 210, the loss of incident light that reaches the photodiode can be reduced.

As the focal point of the microlens 210 is focused more accurately towards the photodiode, performance of the CMOS image sensor can be improved, and the microlens 210 can be formed, easily.

The CMOS image sensor can be fabricated by the following exemplary fabrication process.

FIGS. 3A to 3E illustrate cross-sections of exemplary structures showing the steps of an exemplary method for fabricating a CMOS image sensor in accordance with embodiments of the present invention.

Figure 3A:
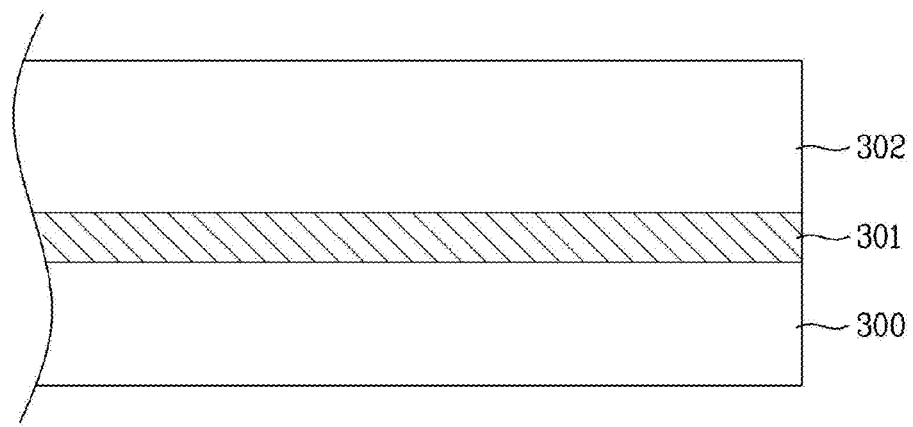
FIGS. 3A to 3E illustrate cross-sections showing structures formed after steps of an exemplary method for fabricating a CMOS image sensor in accordance with various embodiments of the present invention.

Referring to FIG. 3A, an insulating film 301, such as a gate insulating film (e.g., silicon dioxide) or an interlayer insulating film (e.g., one or more layers of silicon nitride and/or silicon dioxide, which may be undoped, enriched with silicon, or doped with fluorine, carbon, or boron and/or phosphorous), is formed on a semiconductor substrate 300. The gate insulating film may be formed by wet or dry thermal oxidation of exposed silicon, and the interlayer insulating film may be formed by chemical vapor deposition (CVD) from corresponding silicon, oxygen, nitrogen and/or dopant sources. A first protective film 302 including an oxide film (e.g., silicon dioxide) or a nitride film (e.g., silicon nitride) is formed on an entire surface of the insulating film 301.

In order to protect the microlenses 306 to be formed in subsequent processing, a thermal resin (TR) or a thin TEOS (tetraethyl orthosilicate)-based oxide layer may be deposited on an entire surface of the semiconductor substrate 300, to form a second protective film (not shown).

Figure 3B:
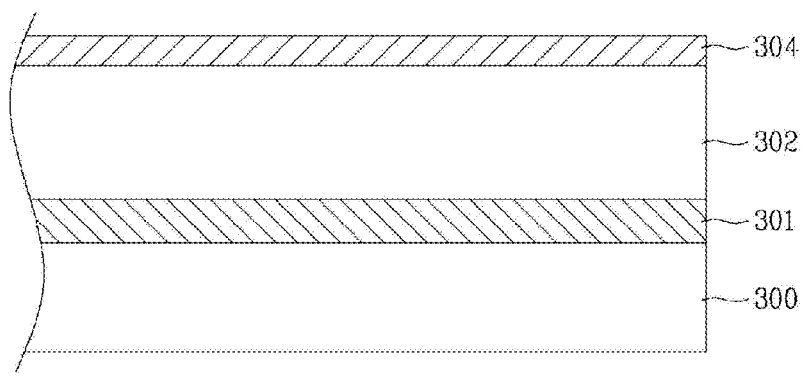

Referring to FIG. 3B, a silicon nitride film or a silicon oxynitride film is deposited on an entire surface of the semiconductor substrate 300 to form a planarizing layer 304, and the planarizing layer 304 is subjected to photolithographic patterning and etching to etch the planarizing layer 304 selectively to retain the planarizing layer 304 in portions of the CMOS image sensor other than the metal pad portions.

Figure 3C:
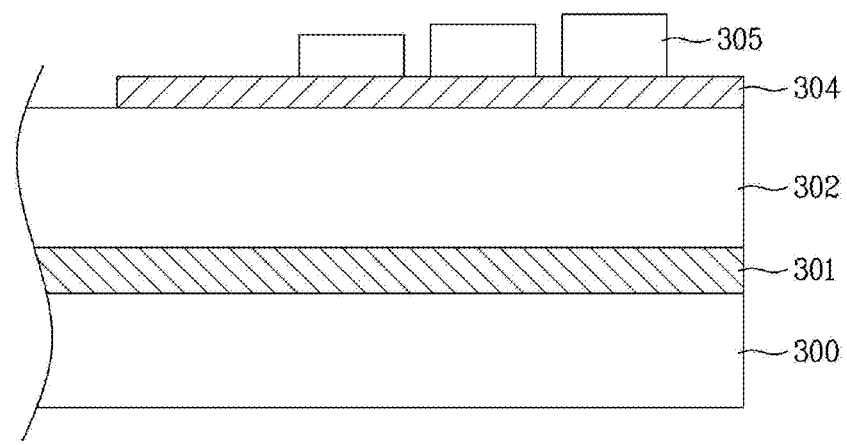

Referring to FIG. 3C, a color filter layer 305 comprising a plurality of color filters 305a, 305b and 305c are formed on the planarizing layer 304 over respective photodiode regions (not shown). The color filter layer 305 has red, green and blue (or, alternatively, yellow, cyan and magenta) color filters 305a, 305b and 305c respectively formed thereon by spin-on deposition of a polymeric resist composition further containing one or more dyes that selective allow light of a certain wavelength or wavelength band to pass through, photolithographic patterning and development. In one embodiment, the color filters 305a-c comprise a negative photoresist, in which case the corresponding deposited color filter layers thus are exposed and developed with a developing liquid to remove exposed portions. For example, after coating the photoresist (not shown), the photoresist is subjected to exposure and development to pattern the photoresist.

In this instance, the color filter layer 305 has filters 305a-c of three different colors (e.g., red, green and blue colors). The color filters 305a-c having different colors may also have thicknesses different from one another. In one embodiment, the color filters have heights that are inversely proportional to the wavelength(s) of light passing through the color filter. In other words, a red color filter may have a first height, a green color filter may have a second height, and a blue color filter may have a third height, wherein the third height is greater than the second height, and the second height is greater than the first height.

Figure 3D:
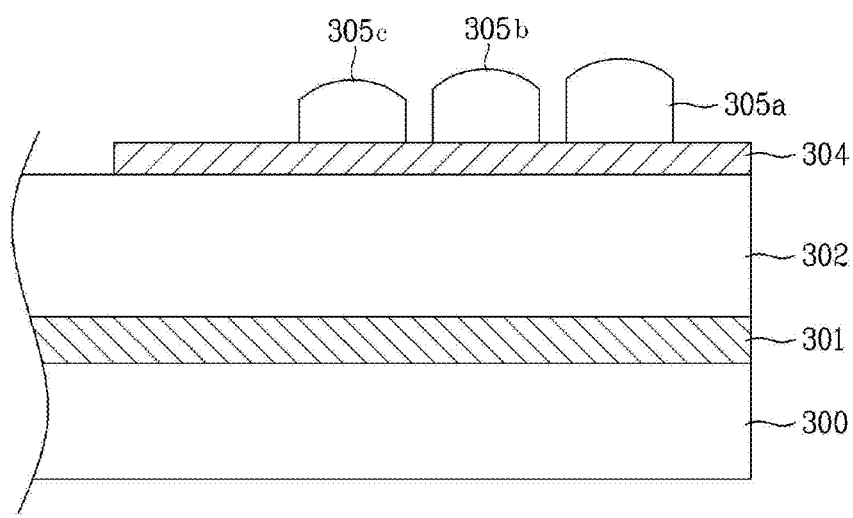

Referring to FIG. 3D, at the time that each patterned color filter is developed after the exposure, edge portions of an upper surface of the color filter (e.g., blue filter 305a) can by overdeveloped (e.g., developed excessively) to form rounded edge portions. For example, when the developer comprises a tetramethylammonium hydroxide (TMAH) solution (about 2.38% by weight), development for about 2~5 minutes creates the desired effect.

In one embodiment, the degree of corner rounding depends on the length of the development time. Thus, the blue color filter may be formed by developing with a developer for a first length of time, a green color filter may be formed by developing with the same developer for a second length of time, and a red color filter may be formed by developing with the same developer for a third length of time, wherein the third length of time is greater than the second length of time, and the second length of time is greater than the first length of time. In another embodiment, the degree of corner rounding depends on the concentration of the active reagent in the developer. Thus, the blue color filter may be formed by developing with a developer having a first concentration of active reagent (e.g., TMAH), a green color filter may be formed by developing with a developer having a second concentration of active reagent, and a red color filter may be formed by developing with a developer having a third concentration of active reagent, wherein the third concentration of active reagent is greater than the second concentration of active reagent, and the second concentration of active reagent is greater than the first concentration of active reagent. Thereafter, if heated (e.g., at about 300° C. for about 2~5 minutes) with a hot plate, the color filter shrinks, further rounding the upper portion (or edges_ of the color filters 305a, 305b and 305c.

Figure 3E:
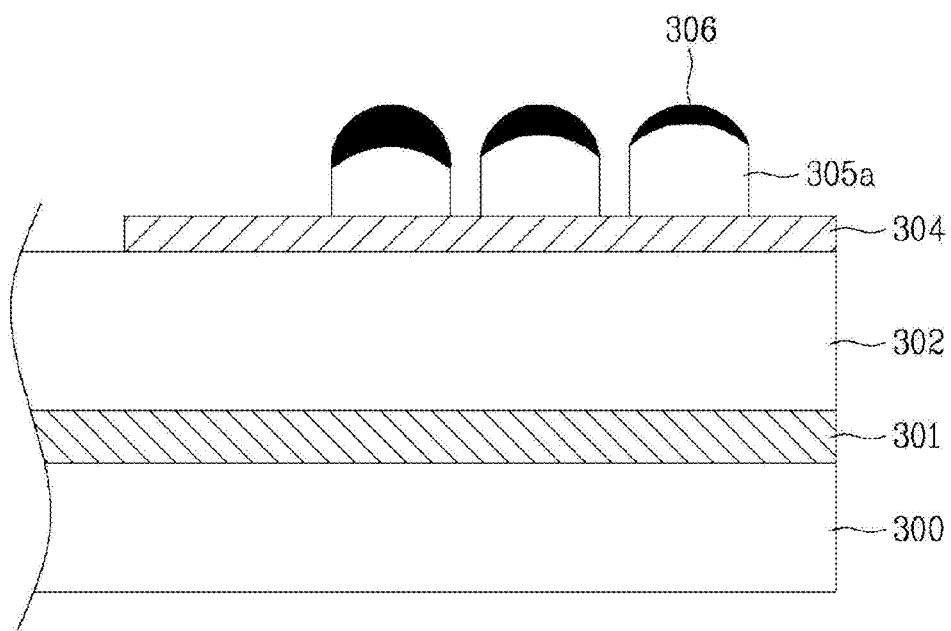

Referring to FIG. 3E, microlenses 306 of a fixed curvature are deposited on the respective color filters (e.g., color filter 305a). The microlenses 306 are respectively formed on the color filters by depositing an oxide (e.g., silicon dioxide, by CVD from a silicon source such as TEOS or silane and an oxygen source such as dioxygen and/or ozone) to a thickness of about 10~500 Å on each of the color filters 305a, 305b and 305c. In certain embodiments, the microlenses 306 have a radius of curvature inversely proportional to the wavelength(s) of light passing through the corresponding color filter.

For example, to the top of the entire structure having the color filters 305a, 305b and 305c formed thereon, a thick coat of photoresist (not shown) is applied as a microlens precursor material to cover the color filter 305a. Thus, the photoresist has a thickness greater than the height of the thickest color filter. In general, the photoresist is substantially transparent and/or translucent.

Then, exposure and development steps are performed using a predetermined photo mask (not shown), to remove a width of photoresist from between the color filters, and form a plurality of microlens precursors (not shown) spaced from one another. In general, the area dimension(s) of each microlens precursor (e.g., the radius or the length and width) are smaller than that of the corresponding color filter on which it is formed. This is for securing a space for preventing adjacent microlenses from merging, which may result from different amounts of flow of the photoresist at the time of a subsequent reflow step.

The microlens precursors are heated to reflow the patterned photoresist. The reflow step is performed to form each microlens 306 in a shape of a dome on top of the corresponding color filter.

Once the microlenses 306 are formed on the color filters 305a, 305b and 305c by above method, the wavelengths of light passing through the color filters can be different from one another, and the focal points of light passing through the combined color filter-microlens units can be controlled by controlling the radii of curvatures of the microlenses, respectively.

Moreover, the planarizing film on the color filter layer in the related art can be omitted, permitting, not only to simplify the production and/or fabrication process and reduce the production cost, but also to improve the sensitivity of the CMOS image sensor.

It will be apparent to those skilled in the art that various modifications and variations can be made in the present invention without departing from the spirit or scope of the invention. Thus, it is intended that the present invention covers the modifications and variations of this invention provided they come within the scope of the appended claims and their equivalents.

What is claimed is:

1. A method for fabricating a CMOS image sensor comprising the steps of:
    forming a plurality of color filters by photolithographically patterning a photoresist composition to form a patterned color filter, and developing the patterned color filter with a developer that comprises tetramethylammonium hydroxide (TMAH) solution for 2-5 minutes to form rounded edge portions on the color filters; and
    forming microlenses on the color filters so as to have radii of curvature that vary with a wavelength of the corresponding color filter, respectively.

2. The method as claimed in claim 1, wherein forming the plurality of color filters comprises heating on a hot plate at 300° C.~350° C.

3. The method as claimed in claim 1, wherein the microlenses have radii of curvature inversely proportional to the wavelength of light passing through the corresponding color filter, respectively.

4. The method as claimed in claim 3, wherein the microlenses have a dome shape.

5. The method as claimed in claim 1, wherein forming the plurality of color filters comprises depositing a first resist composition further containing one or more first dyes that selectively allow light of a first predetermined wavelength or wavelength band to pass through, photolithographically patterning the first resist composition, and developing the photolithographically patterned first resist composition.

6. The method as claimed in claim 5, wherein forming the plurality of color filters further comprises depositing a second resist composition further containing one or more second dyes that selectively allow light of a second predetermined wavelength or wavelength band to pass through, photolithographically patterning the second resist composition, and developing the photolithographically patterned second resist composition.

7. The method as claimed in claim 6, wherein forming the plurality of color filters further comprises depositing a third resist composition further containing one or more third dyes that selectively allow light of a third predetermined wavelength or wavelength band to pass through, photolithographically patterning the third resist composition, and developing the photolithographically patterned third resist composition.

8. The method as claimed in claim 1, wherein the plurality of color filters comprises a red color filter, a green color filter and a blue color filter.

9. The method as claimed in claim 8, wherein the red color filter has a first height, the green color filter has a second height, and a blue color filter has a third height, wherein the third height is greater than the second height, and the second height is greater than the first height.

10. The method as claimed in claim 1, wherein forming the microlenses comprises depositing an oxide on each of the color filters.

11. The method as claimed in claim 1, wherein forming the microlenses comprises depositing a photoresist on the color filters, exposing and developing the photoresist to remove a width thereof from between the color filters and to form a plurality of microlens precursors, and reflowing the plurality of microlens precursors.

12. The method as claimed in claim 1, wherein the microlenses comprises an oxide or a photoresist.

13. The method as claimed in claim 1, wherein the plurality of color filters have convex uppermost surfaces.

14. The method as claimed in claim 13, wherein the plurality of color filters comprises a first color filter having a first height, a second color filter having a second height, and a third color filter having a third height.

15. The method as claimed in claim 14, wherein the third height is greater than the second height, and the second height is greater than the first height.

* * * * *